(12) United States Patent
Her et al.

(10) Patent No.: US 9,484,207 B2
(45) Date of Patent: Nov. 1, 2016

(54) SEMICONDUCTOR DEVICE STRUCTURE AND METHOD FOR FORMING THE SAME

(71) Applicant: Taiwan Semiconductor Manufacturing Co., Ltd, Hsin-Chu (TW)

(72) Inventors: Jeng-Chang Her, Tainan (TW); Chia-Cheng Lin, Taipei (TW); Hung-Jui Chang, Shetou Shiang (TW); Yu-Sheng Su, Tainan (TW); Shu-Huei Suen, Jhudong Township (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 14/292,167

(22) Filed: May 30, 2014

(65) Prior Publication Data

US 2015/0348838 A1    Dec. 3, 2015

(51) Int. Cl.
*H01L 21/768*    (2006.01)
*H01L 21/285*    (2006.01)

(52) U.S. Cl.
CPC ... *H01L 21/28518* (2013.01); *H01L 21/76843* (2013.01); *H01L 21/76855* (2013.01); *H01L 21/76897* (2013.01); *H01L 2924/0002* (2013.01)

(58) Field of Classification Search
CPC ............ H01L 21/28518; H01L 211/76843; H01L 21/76855
See application file for complete search history.

(56) References Cited

U.S. PATENT DOCUMENTS

| | | | | |
|---|---|---|---|---|
| 7,893,522 B2 * | 2/2011 | Noda | ............. | C23C 16/24 257/618 |
| 7,923,319 B2 * | 4/2011 | Futase | ............. | H01L 21/67167 257/E21.409 |
| 8,222,113 B2 * | 7/2012 | Ting | ............. | H01L 29/66636 257/E21.546 |
| 8,859,398 B2 * | 10/2014 | Letz | ............. | H01L 29/665 257/E21.199 |
| 2010/0248463 A1 | 9/2010 | Letz et al. | | |

* cited by examiner

*Primary Examiner* — Savitr Mulpuri
(74) *Attorney, Agent, or Firm* — Birch, Stewart, Kolasch & Birch, LLP

(57) ABSTRACT

A method for forming a semiconductor device structure is provided. The method includes providing a wafer having a central portion and a peripheral portion surrounding the central portion. The method includes forming a first dielectric layer over the central portion. The first dielectric layer has first contact openings exposing conductive regions of the wafer. The method includes forming a protective layer over the peripheral portion. The method includes after forming the protective layer, performing a metal silicide process to form metal silicide structures over the conductive regions of the wafer.

14 Claims, 14 Drawing Sheets

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, since the feature sizes continue to decrease, fabrication processes continue to become more difficult to perform. Therefore, it is a challenge to form reliable semiconductor devices with smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
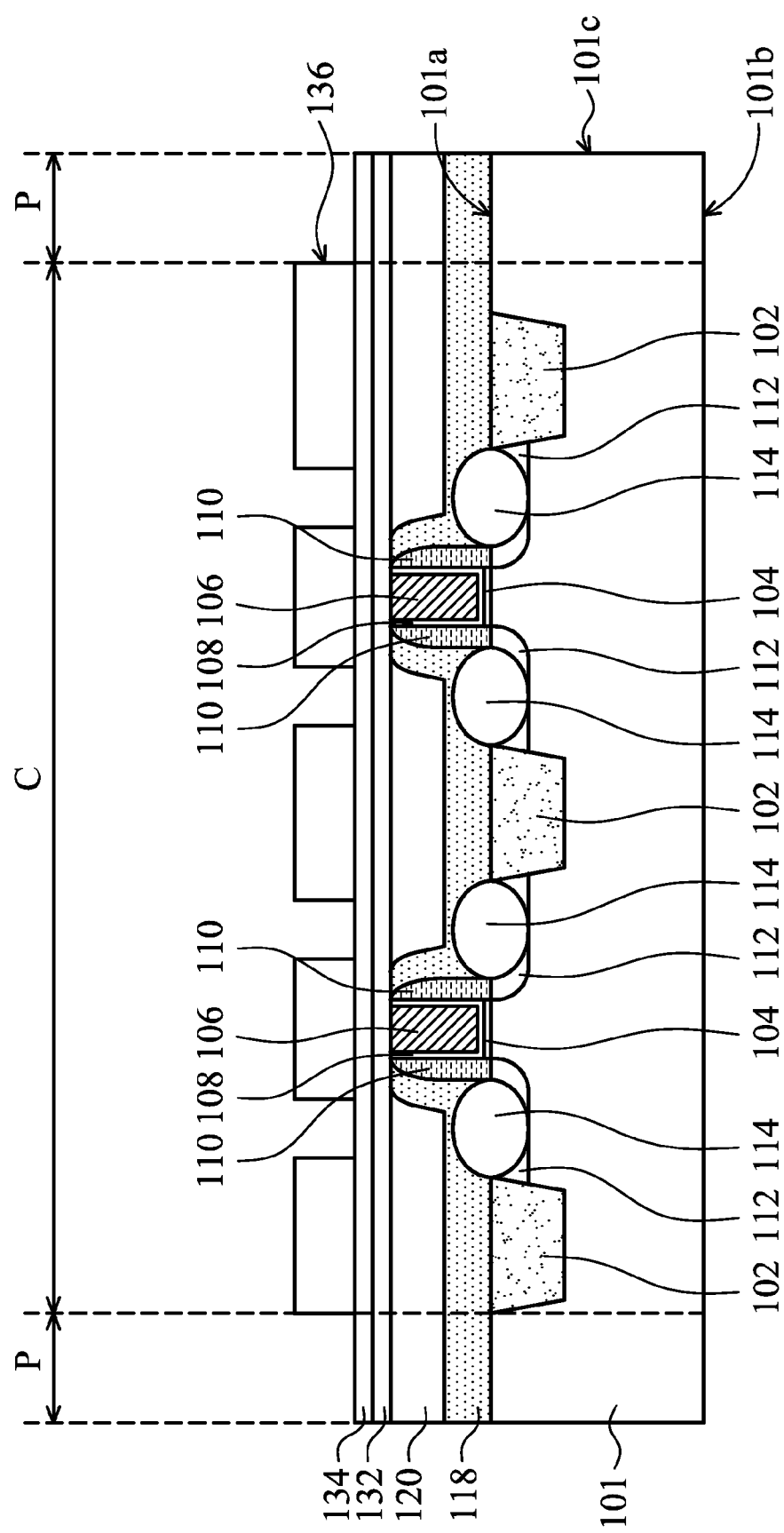
FIGS. 1A-1L are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

FIGS. 1A-1L are cross-sectional views of various stages of a process for forming a semiconductor device structure, in accordance with some embodiments. Referring to FIG. 1A, a wafer 101 is provided. The wafer 101 has a central portion C and a peripheral portion P surrounding the central portion C, in accordance with some embodiments. The wafer 101 has a front surface 101a, a back surface 101b opposite to the front surface 101a and a sidewall 101c, in accordance with some embodiments.

In some embodiments, the wafer 101 is made of an elementary semiconductor material including silicon or germanium in a single crystal, polycrystal, or amorphous structure. In some other embodiments, the wafer 101 is made of a compound semiconductor, such as silicon carbide, gallium arsenide, gallium phosphide, indium phosphide, indium arsenide, an alloy semiconductor, such as SiGe, or GaAsP, or a combination thereof. The wafer 101 may also include a multi-layer semiconductor substrate, a semiconductor-on-insulator (SOI) substrate, or a combination thereof. The SOI substrate includes, for example, a silicon-on-insulator substrate or a germanium-on-insulator substrate.

In some embodiments, an isolation structure 102 is formed in the wafer 101 to define various active regions in the wafer 101, and to electrically isolate neighboring devices (e.g. transistors) from one another. In some embodiments, the isolation structure 102 is made of a dielectric material, such as silicon oxide, silicon nitride, silicon oxynitride, fluoride-doped silicate glass (FSG), a low-K dielectric material, other suitable materials, or combinations thereof. In some embodiments, the isolation structure 102 is formed by using an isolation technology, such as local oxidation of semiconductor (LOCOS), shallow trench isolation (STI), or the like.

In some embodiments, the formation of the isolation structure 102 includes patterning the wafer 101 by a photolithography process, etching a trench in the wafer 101 (for example, by using a dry etching, wet etching, plasma etching process, or combinations thereof), and filling the trench (for example, by using a chemical vapor deposition process) with the dielectric material. In some embodiments, the filled trench may have a multi-layer structure, such as a thermal oxide liner layer filled with silicon nitride or silicon oxide.

As shown in FIG. 1A, gate dielectric layers 104 and gate electrodes 106 are formed over the front surface 101a of the wafer 101, in accordance with some embodiments. The gate dielectric layers 104 and gate electrodes 106 are formed over the central portion C of the wafer 101, in accordance with some embodiments.

In some embodiments, the gate dielectric layers 104 are made of a dielectric material, such as a high dielectric constant (high-k) material. The high-k material may be made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof. The gate dielectric layers 104 are formed by an atomic layer deposition (ALD) process, a chemical vapor deposition (CVD) process, or other suitable processes.

The gate electrodes 106 (also called metal gate electrodes) are formed by a gate-last approach or a replacement-gate (RPG) approach. The gate electrodes 106 may be made of a suitable metal material, such as aluminum, tungsten, gold, platinum, cobalt, another suitable metal, an alloy thereof, or a combination thereof. In some embodiments, the gate electrodes 106 are formed using a PVD process, CVD process, plating process, or the like, or a combination thereof.

As shown in FIG. 1A, the gate electrodes 106 are formed between the spacers 110, which are previously formed. The spacers 110 are made of a dielectric material, such as silicon nitride layer, silicon oxynitride layer, or combinations thereof. The structure of the spacers 110 shown in FIG. 1A is merely an example. Other configurations of the spacers 110 are also possible. For example, a sealing layer (not shown) is formed between the spacers 110 and the gate electrode 106 between the spacers 110.

In some embodiments, work function metal layers 108 are formed between the spacers 110 and the gate electrodes 106 and between the gate electrodes 106 and the gate dielectric layers 104. The work function metal layers 108 provide desired work function for transistors to enhance device performance including improved threshold voltage. In the embodiments of forming an NMOS transistor, the work function metal layers 108 can be an n-type metal. The n-type metal may be made of tantalum, tantalum nitride, or combinations thereof.

On the other hand, in the embodiments of forming a PMOS transistor, the work function metal layers 108 can be a p-type metal. The p-type metal may be made of titanium, titanium nitride, other suitable materials, or combinations thereof.

The work function metal layers 108 are made of hafnium, zirconium, titanium, tantalum, aluminum, metal carbides (e.g., hafnium carbide, or zirconium carbide), aluminides, ruthenium or combinations thereof, in accordance with some embodiments. The work function metal layers 108 are formed by using a PVD process, CVD process, ALD process, plating process, another suitable method, or combinations thereof, in accordance with some embodiments.

Doped regions 112 may be formed in the wafer 101 by using a suitable process, such as an ion implantation process. The doped regions 112 may be a heavily doped source region and a heavily doped drain region. The doped regions 112 are also referred to as conductive regions.

Stressors 114 are formed in the doped regions 112 by using suitable processes, in accordance with some embodiments. The suitable processes include, for example, an etching process for removing a portion of the wafer 101 and a selective epitaxial growth (SEG) process. Depending on the desired type of the resulting MOS device, either stressors applying a compressive stress to the channel region (such as SiGe stressors) or stressors applying a tensile stress to the channel region (such as SiC stressors) are formed.

A contact etch stop layer 118 is formed over the wafer 101 and sidewalls of the spacers 110, in accordance with some embodiments. In some embodiments, the contact etch stop layer 118 is made of a dielectric material, such as silicon nitride. In some embodiments, the contact etch stop layer 118 is conformally formed on the wafer 101 and the sidewalls of the spacers 110. However, in some other embodiments, the contact etch stop layer 118 is not formed.

As shown in FIG. 1A, an insulating layer 120 is deposited over the wafer 101, in accordance with some embodiments. The insulating layer 120 is made of, for example, silicon oxides. Each of the gate electrodes 106, the corresponding work function metal layer 108, and the corresponding gate dielectric layer 104 together form a gate stack (i.e., a metal gate stack), which is surrounded by the insulating layer 120.

The insulating layer 120 is made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof, in accordance with some embodiments. The insulating layer 120 is deposited by any suitable process, such as a CVD process, HDPCVD process, spin-on process, sputtering process, or combinations thereof.

A stop layer 132 (also called an insulating layer or a dielectric layer) is deposited over the insulating layer 120, the contact etch stop layer 118, the work function metal layers 108, and the gate electrodes 106, in accordance with some embodiments. The stop layer 132 is made of silicon nitride or other suitable materials.

A passivation layer 134 is formed on the stop layer 132 to protect the stop layer 132 from being damaged during subsequent processes, such as a pre-amorphized implantation (PAI) process, in accordance with some embodiments. The passivation layer 134 is made of, for example, a plasma-enhanced oxide (PEOX) layer. In some embodiments, a patterned mask layer 136 is formed on the passivation layer 134. In some embodiments, the patterned mask layer 136 includes a photoresist material.

Figure 1B:
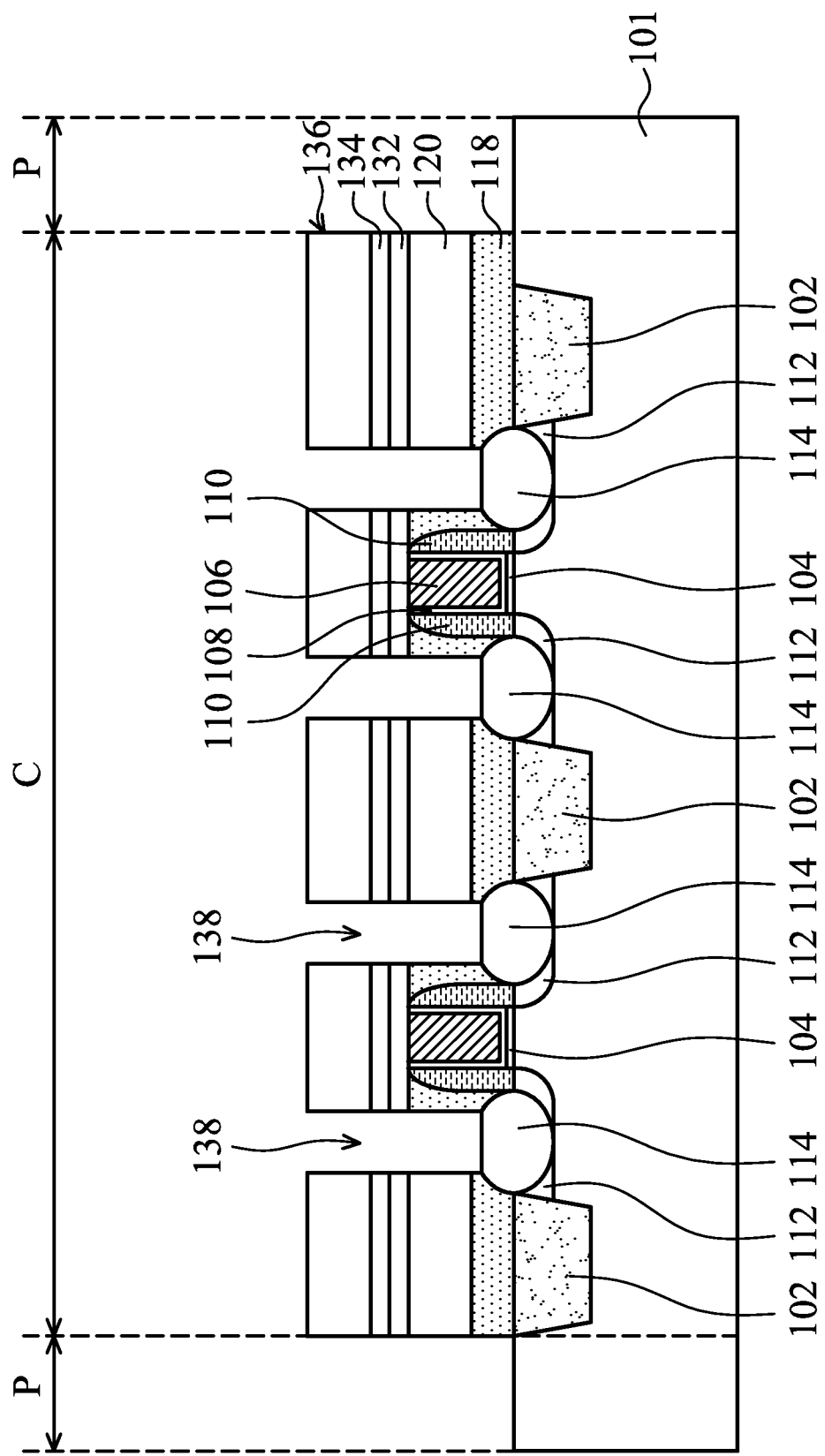

Thereafter, as shown in FIG. 1B, an etching process is performed by using the patterned mask layer 136 as an etching mask, in accordance with some embodiments. Therefore, the passivation layer 134, the stop layer 132, the insulating layer 120, and the contact etch stop layer 118 are partially removed to form contact openings 138, in accordance with some embodiments. The contact openings 138 expose the stressors 114 (and the doped regions 112), respectively, in accordance with some embodiments.

Figure 1C:
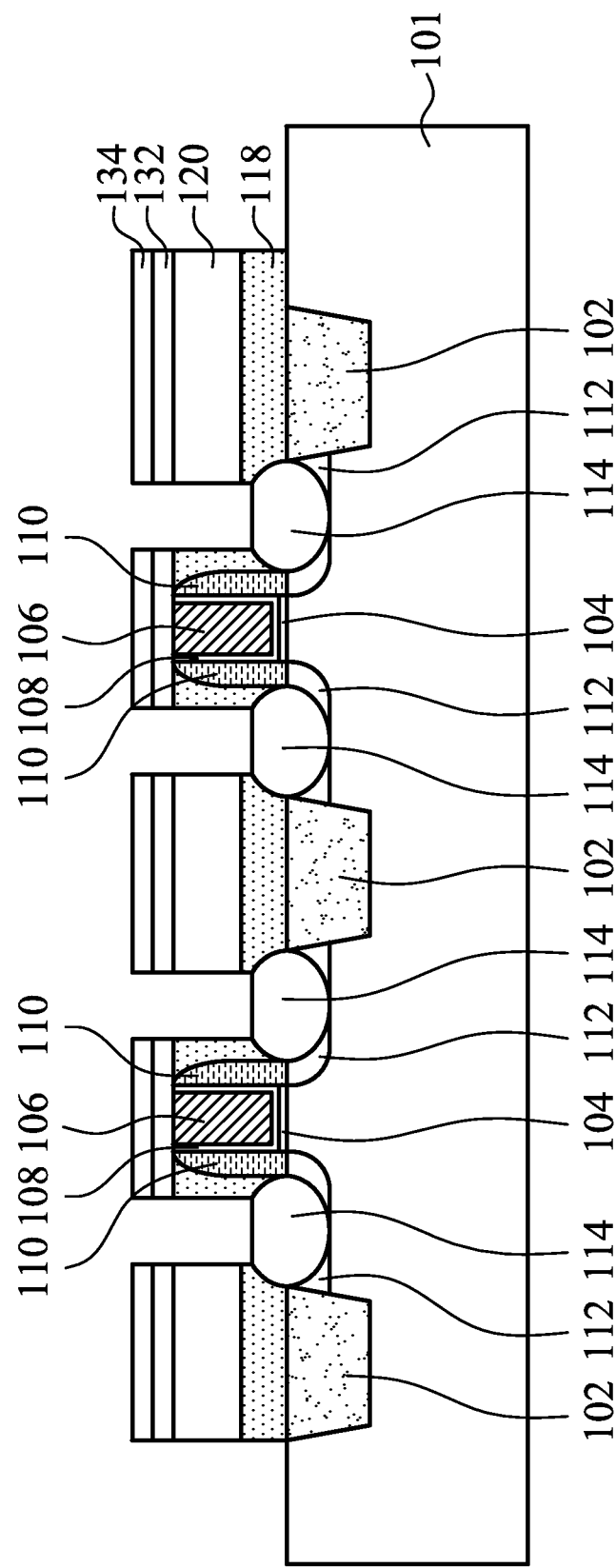

Furthermore, the etching process also removes portions of the passivation layer 134, the stop layer 132, the insulating layer 120, and the contact etch stop layer 118 over the peripheral portion P, in accordance with some embodiments. Therefore, the peripheral portion P is exposed by the passivation layer 134, the stop layer 132, the insulating layer 120, and the contact etch stop layer 118, in accordance with some embodiments. The etching process includes, for example, a dry etching process. Thereafter, as shown in FIG. 1C, the patterned mask layer 136 is removed.

Figure 1D:
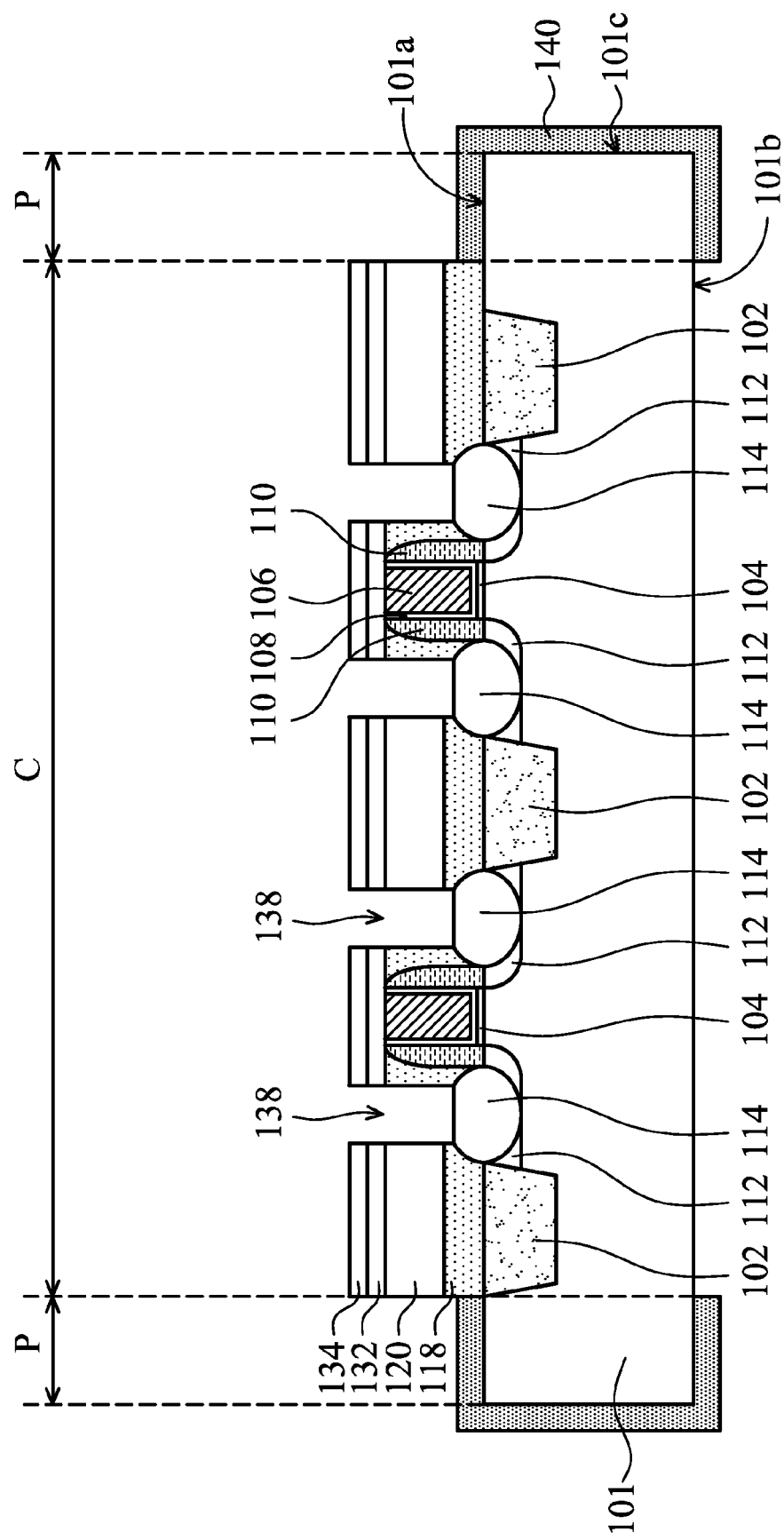

Afterwards, as shown in FIG. 1D, a protective layer 140 is formed over the peripheral portion P of the wafer 101, in accordance with some embodiments. In some embodiments, the protective layer 140 is formed over the front surface 101a of the wafer 101. In some embodiments, the protective layer 140 is formed over the front surface 101a and the sidewall 101c of the wafer 101. In some embodiments, the protective layer 140 is formed over the front surface 101a, the sidewall 101c and the back surface 101b of the wafer 101.

In some embodiments, the protective layer 140 is a continuous layer. In some embodiments, the protective layer 140 surrounds the central portion C of the wafer 101. In some embodiments, the protective layer 140 surrounds the insulating layer 120.

In some embodiments, the protective layer 140 is configured to prevent metal silicide structures from forming over the peripheral portion P during subsequent metal silicide processes. In some embodiments, the protective layer 140 includes oxides, nitrides or other suitable materials, which do not react with metals in subsequent metal silicide processes. In some embodiments, the protective layer 140 includes silicon oxides or silicon nitrides.

In some embodiments, the protective layer 140 is formed by performing an oxidation process on the peripheral portion P of the wafer 101. In some embodiments, the oxidation process includes an oxygen plasma process. In some other embodiments, the oxidation process includes dipping the peripheral portion P of the wafer 101 into an oxidizing solution. The oxidizing solution includes, for example, a hydrogen peroxide solution. In some embodiments, the protective layer 140 is formed by performing a deposition process. The deposition process includes, for example, a chemical vapor deposition process.

As shown in FIG. 1D, a pre-amorphized implantation (PAI) process is performed to turn portions of the stressors 114 exposed by the contact openings 138 into amorphous portions (not shown), in accordance with some embodiments. The PAI process may enhance dopant activation. The PAI prevents subsequently doped impurities from channeling through spaces within the crystal lattice structure and reaching depths greater than desired.

Figure 1E:
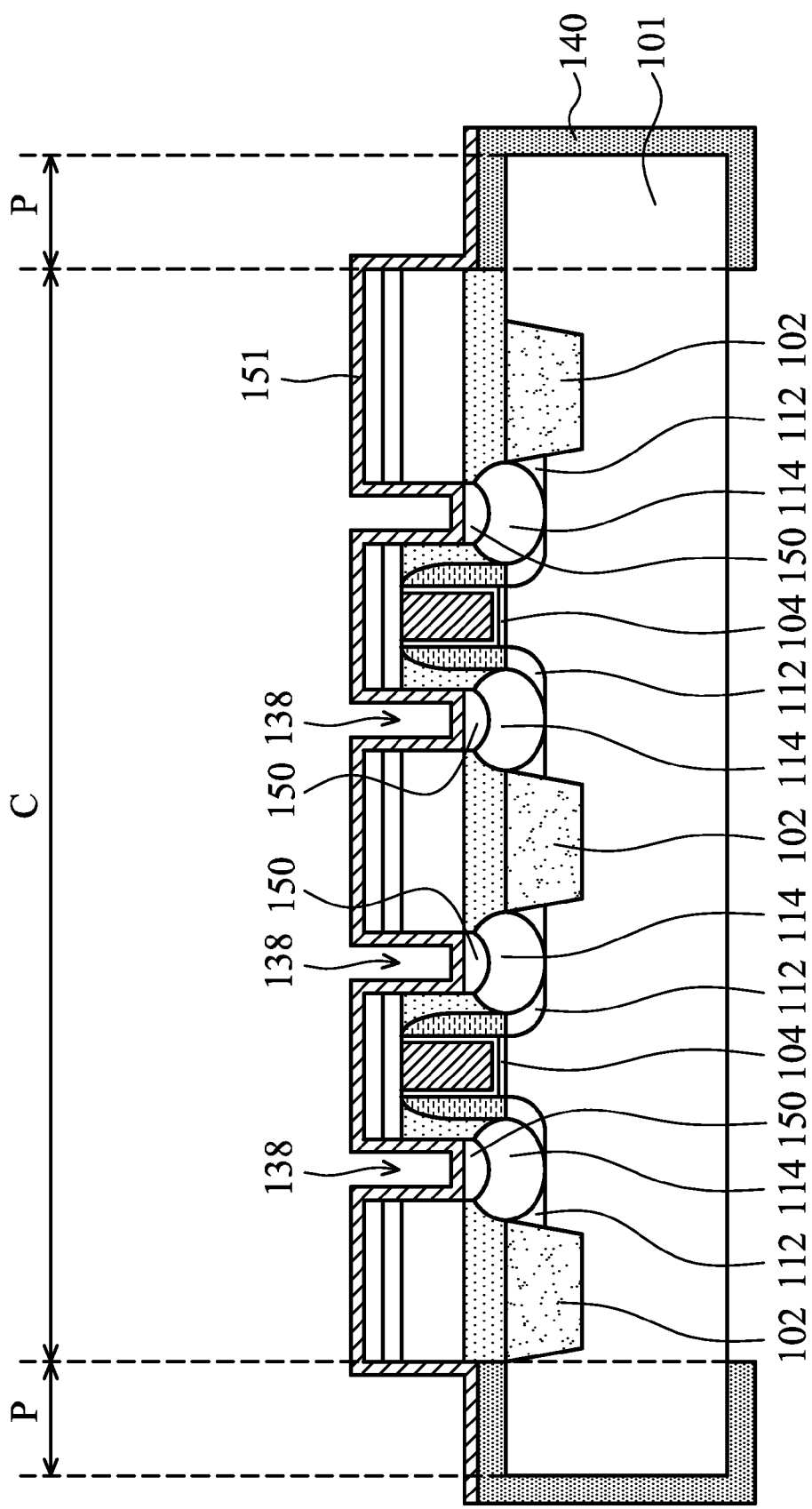

Thereafter, as shown in FIG. 1E, a metal silicide process is performed on the stressors 114 to turn the amorphous portions (not shown) of the stressors 114 into metal silicide structures 150, in accordance with some embodiments. In some embodiments, the metal silicide process includes forming a metal layer 151 over the amorphous portions (not shown) of the stressors 114 and thereafter performing an annealing process.

The metal layer 151 includes, for example, nickel (Ni), titanium (Ti), cobalt (Co), platinum (Pt), ytterbium (Yb), molybdenum (Mo), erbium (Er), or combinations thereof. The metal silicide structures 150 include nickel silicide or a silicide material of a suitable metal material.

In some embodiments, the metal layer 151 is also formed over the protective layer 140. The protective layer 140 separates the peripheral portion P of the wafer 101 from the metal layer 151, in accordance with some embodiments. Therefore, the protective layer 140 prevents the peripheral portion P of the wafer 101 from reacting with the metal layer 151 during the metal silicide process, in accordance with some embodiments.

As a result, the protective layer 140 prevents metal silicide structures from forming over the peripheral portion P, which prevents the metal silicide structures from affecting or contaminating the subsequent processes (such as a dry etching process).

Figure 1F:
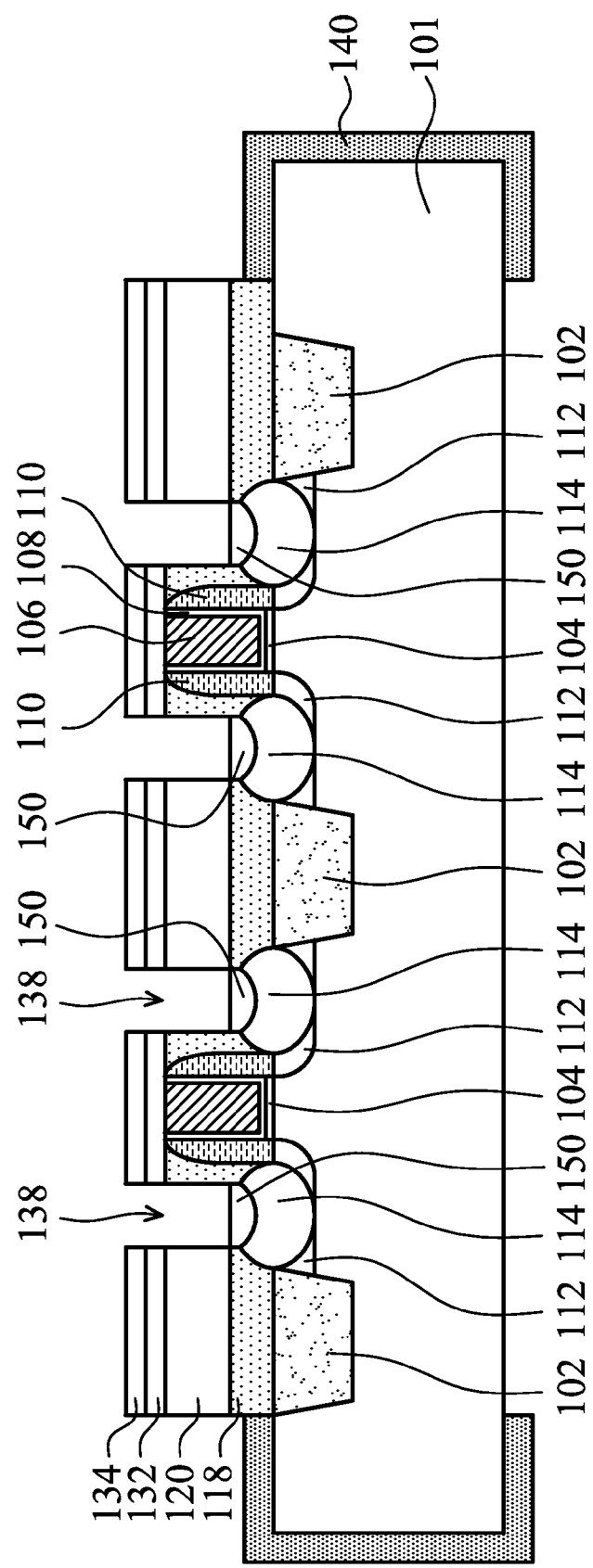

Afterwards, as shown in FIG. 1F, the metal layer 151, which is unreacted with the amorphous portions (not shown) of the stressors 114, is removed. The removal process of the metal layer 151 includes, for example, an etching process. The etching process includes, for example, a wet etching process, a dry etching process, or combinations thereof. In some embodiments, a wet etching process is adopted to remove the unreacted metal layer. In some embodiments, the removal process of the metal layer 151 does not remove the protective layer 140.

Figure 1G:
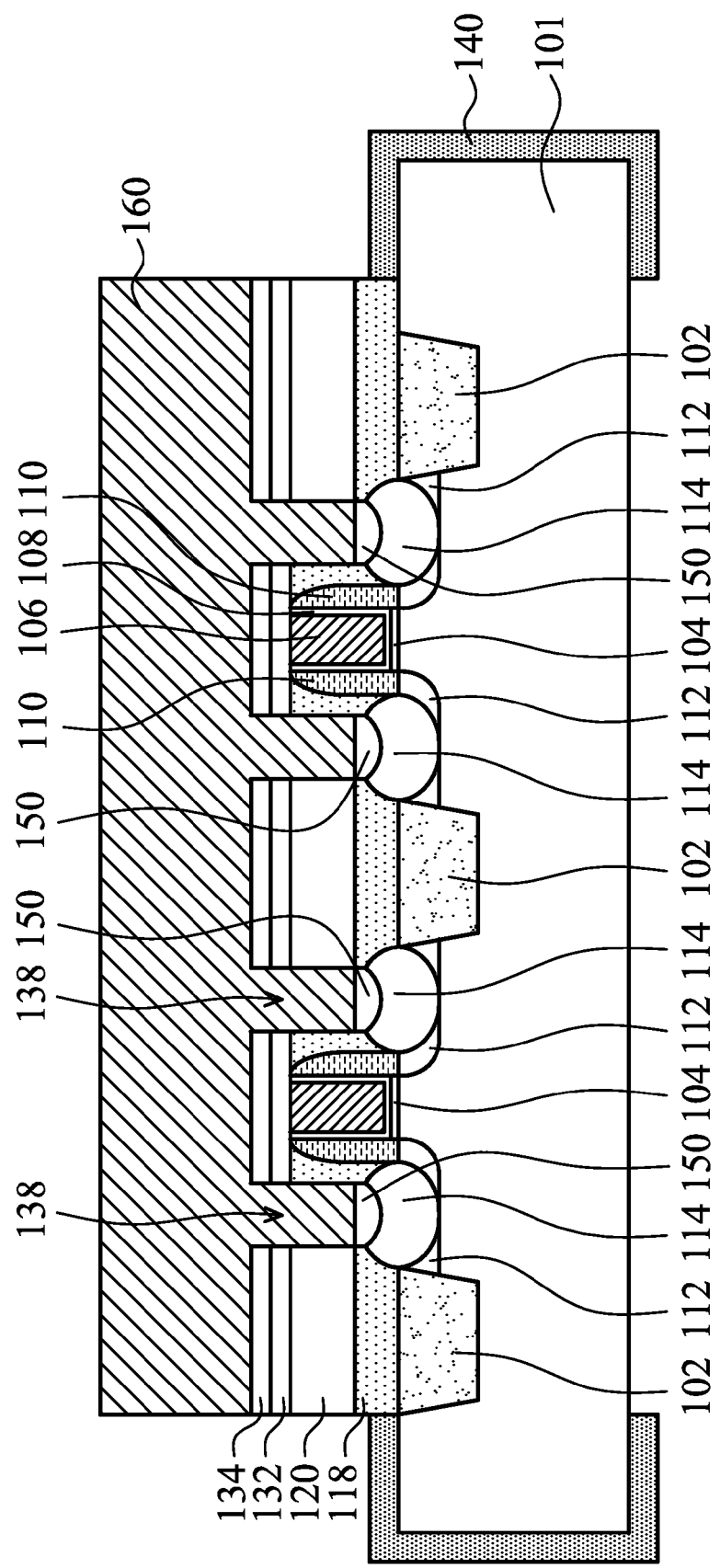

As shown in FIG. 1G, a conductive layer 160 is deposited over the passivation layer 134, in accordance with some embodiments. The conductive layer 160 is filled into the contact openings 138 to electrically contact the metal silicide structures 150, in accordance with some embodiments. The conductive layer 160 is deposited by, for example, a PVD process or other suitable processes. The conductive layer 160 is made of, for example, tungsten or other suitable conductive materials.

Figure 1H:
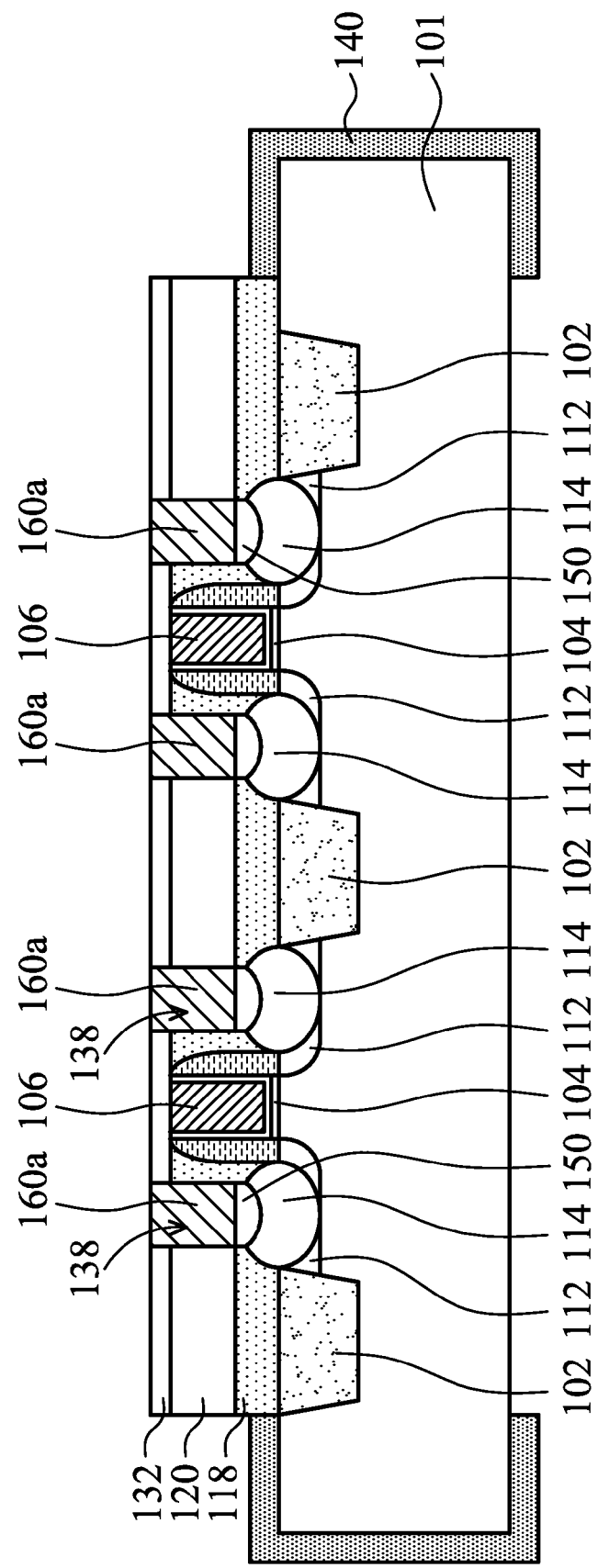

As shown in FIG. 1H, a chemical mechanical polishing (CMP) process is performed to remove the conductive layer 160, which is outside of the contact openings 138, and the passivation layer 134. After the CMP process, the conductive layer 160 remaining in the contact openings 138 forms contact plugs 160a. The contact plugs 160a electrically connect to the metal silicide structures 150 and the doped regions 112 (i.e. the S/D regions).

Figure 1I:
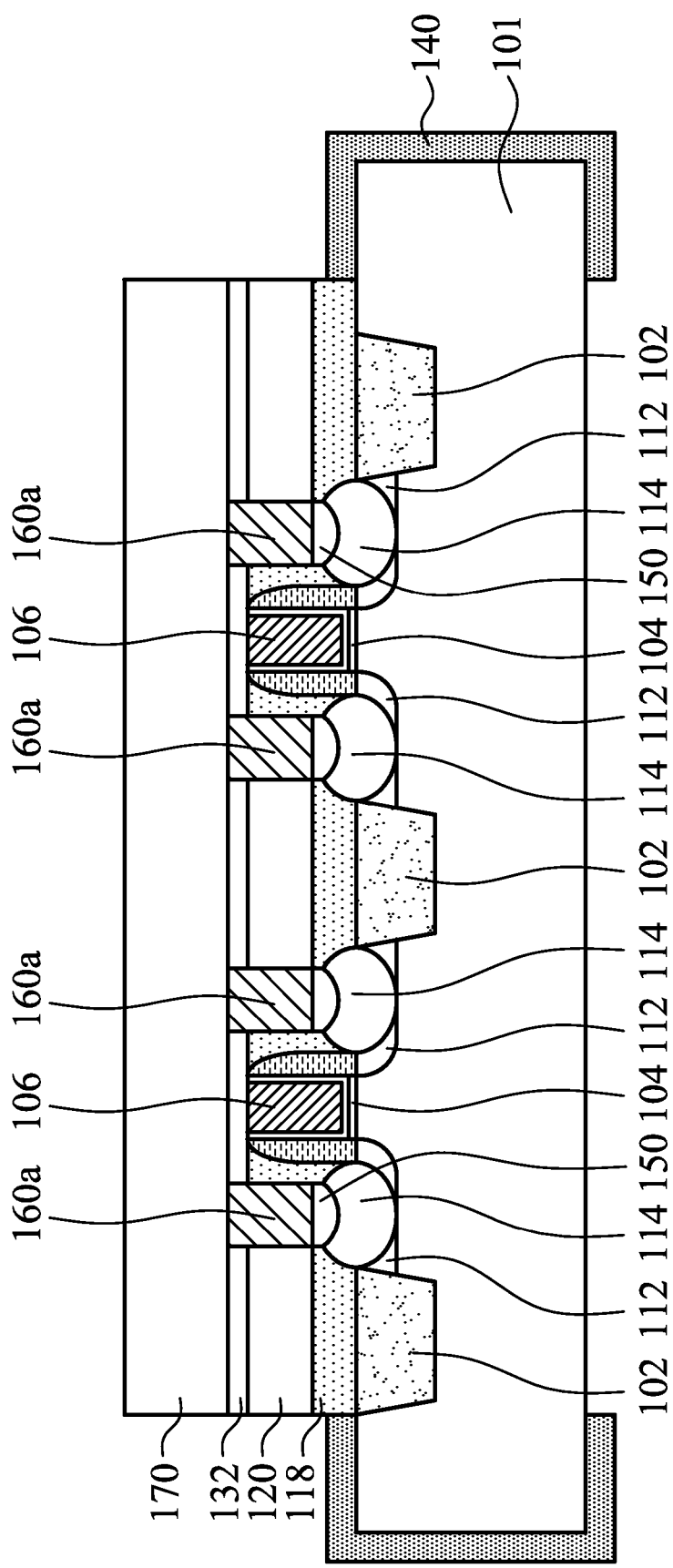

As shown in FIG. 1I, an insulating layer 170 is deposited over the stop layer 132 and the contact plugs 160a, in accordance with some embodiments. The insulating layer 170 is made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof, in accordance with some embodiments. The insulating layer 170 is deposited by any suitable process, such as a CVD process, HDPCVD process, spin-on process, sputtering process, or combinations thereof.

Figure 1J:
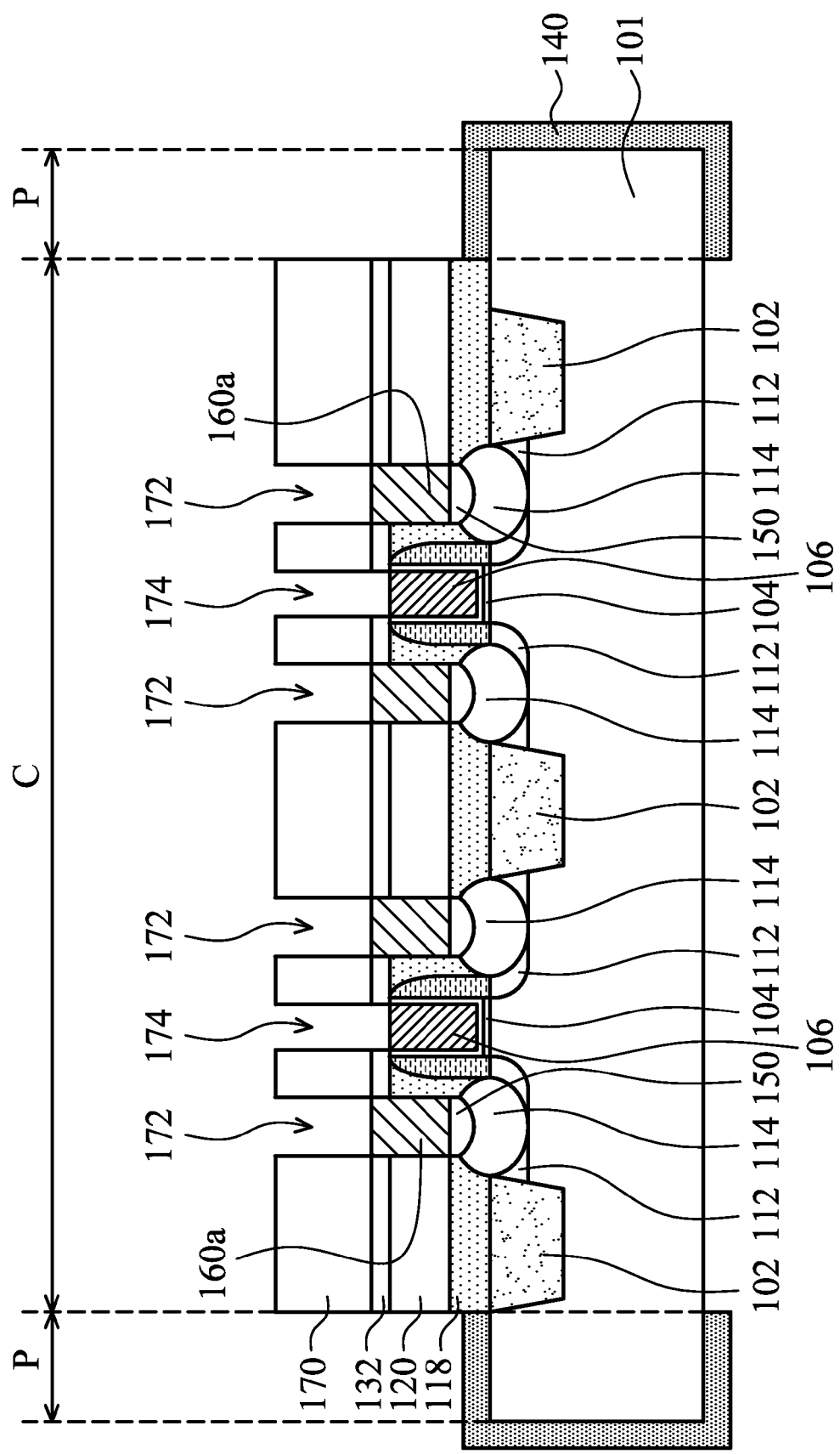

As shown in FIG. 1J, portions of the insulating layer 170 over the contact plugs 160a and the gate electrodes 106 are removed to form contact openings 172 and 174, in accordance with some embodiments. The contact openings 172 expose the contact plugs 160a, and the contact openings 174 expose the gate electrodes 106, in accordance with some embodiments. The removal process of the insulating layer 170 includes a dry etching process.

It should be noted that since there is no metal silicide structure formed over the peripheral portion P, the dry etching process is not affected or contaminated by the metal silicide structure, in accordance with some embodiments.

Figure 1K:
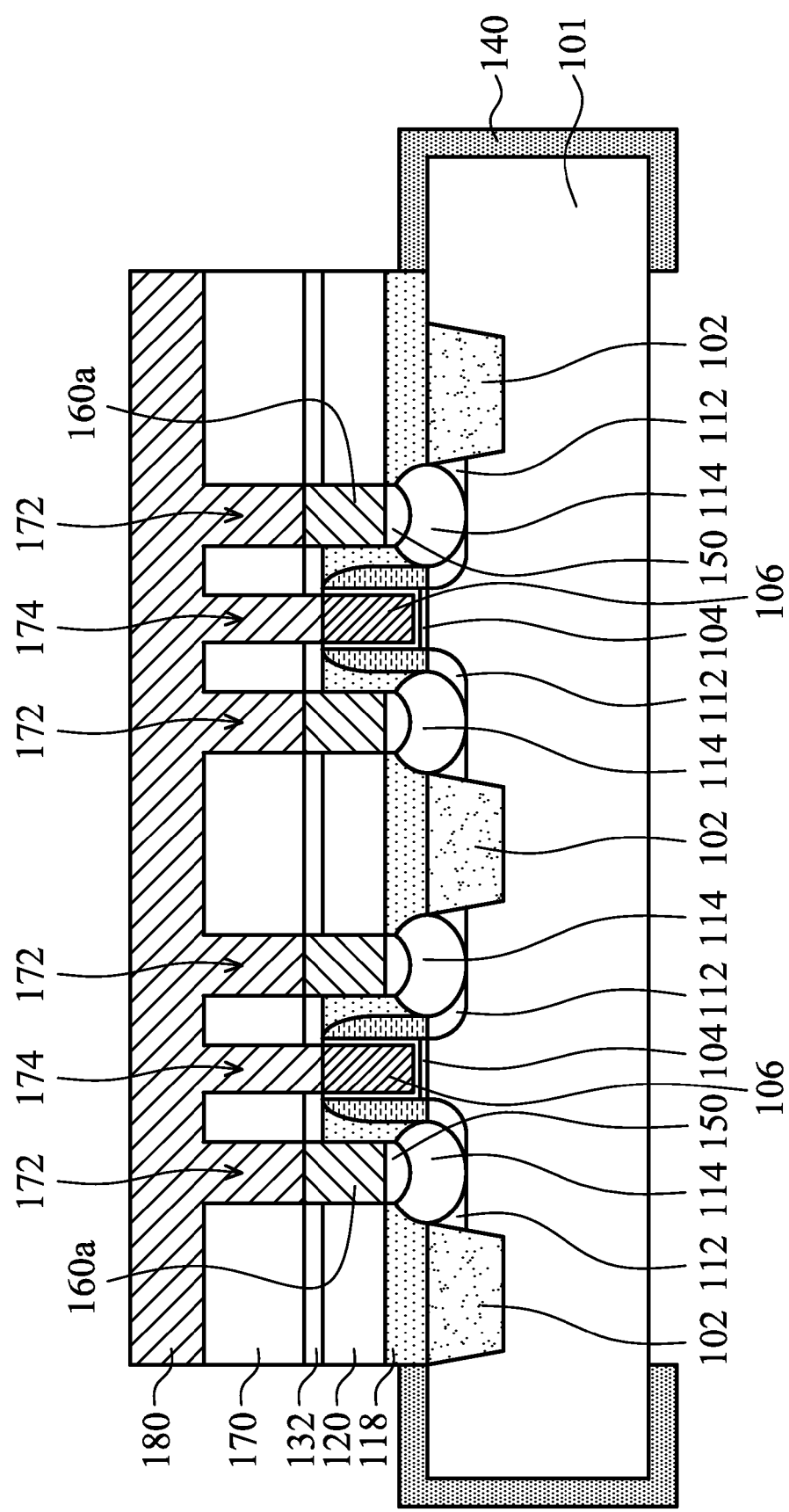

As shown in FIG. 1K, a conductive layer 180 is deposited over the insulating layer 170, in accordance with some embodiments. The conductive layer 180 is filled into the contact openings 172 and 174, in accordance with some embodiments. The conductive layer 180 is deposited by, for example, a PVD process or other suitable processes. The conductive layer 180 is made of, for example, tungsten or other suitable conductive materials.

Figure 1L:
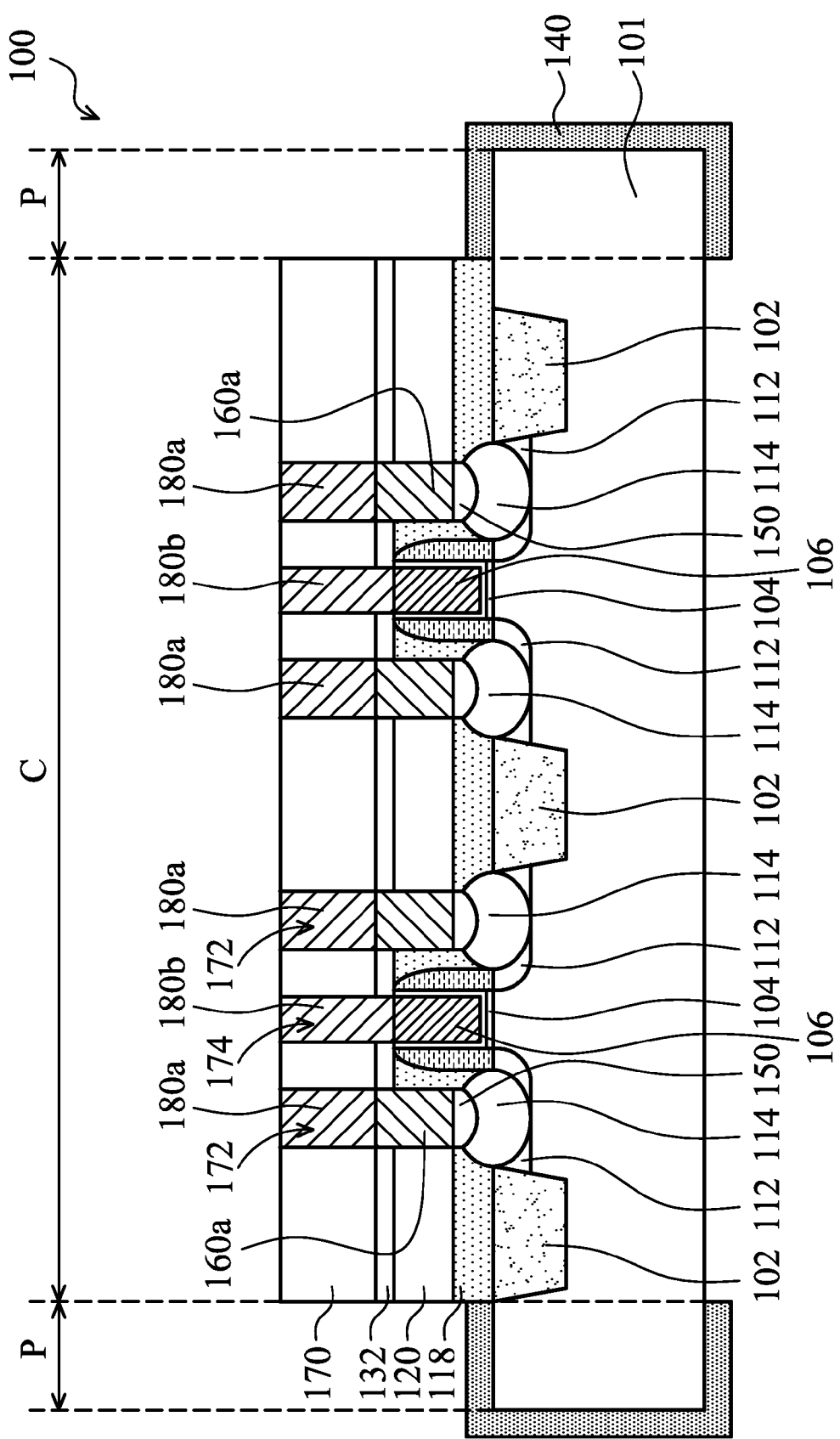

As shown in FIG. 1L, a chemical mechanical polishing process is performed to remove the conductive layer 180, which is outside of the contact openings 172 and 174, in accordance with some embodiments. After the CMP process, the conductive layer 180 remaining in the contact openings 172 forms contact plugs 180a. The contact plugs 180a electrically connect to the contact plugs 160a, respectively.

The conductive layer 180 remaining in the contact openings 174 forms contact plugs 180b. The contact plugs 180b electrically connect to the gate electrodes 106, respectively. As shown in FIG. 1L, a semiconductor device structure 100 is substantially formed.

In some other embodiments (not shown), the contact openings 172 and 174 are formed in different stages, and the contact plugs 180a and 180b are also formed in different stages.

Figure 2:
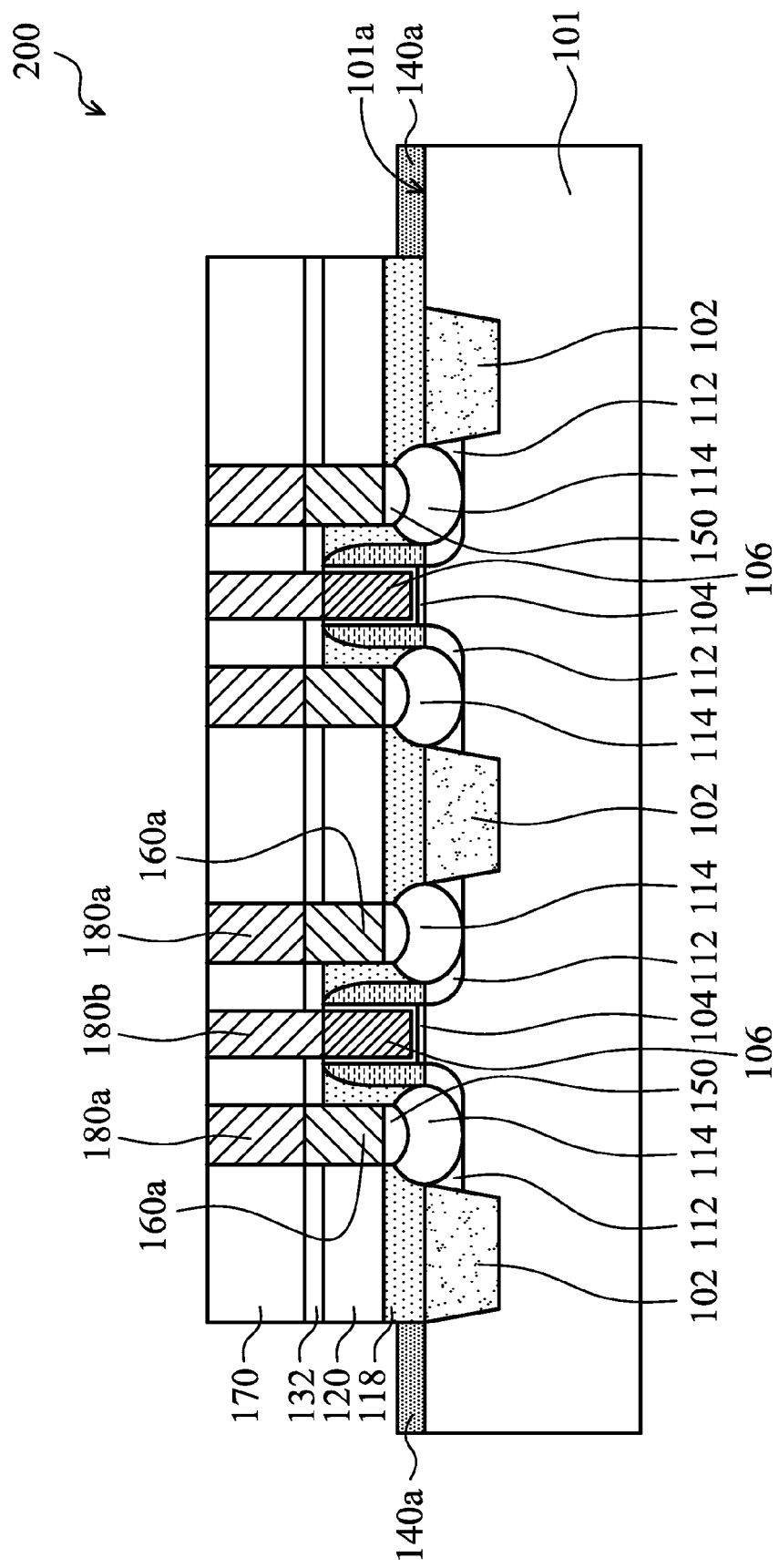
FIG. 2 is a cross-sectional view of a semiconductor device structure, in accordance with some embodiments.

FIG. 2 is a cross-sectional view of a semiconductor device structure, in accordance with some embodiments. As shown in FIG. 2, a semiconductor device structure 200 is similar to the semiconductor device structure 100 of FIG. 1L, except that the protective layer 140a of the semiconductor device structure 200 is only formed over the front surface 101a of the wafer 101.

Figure 3:
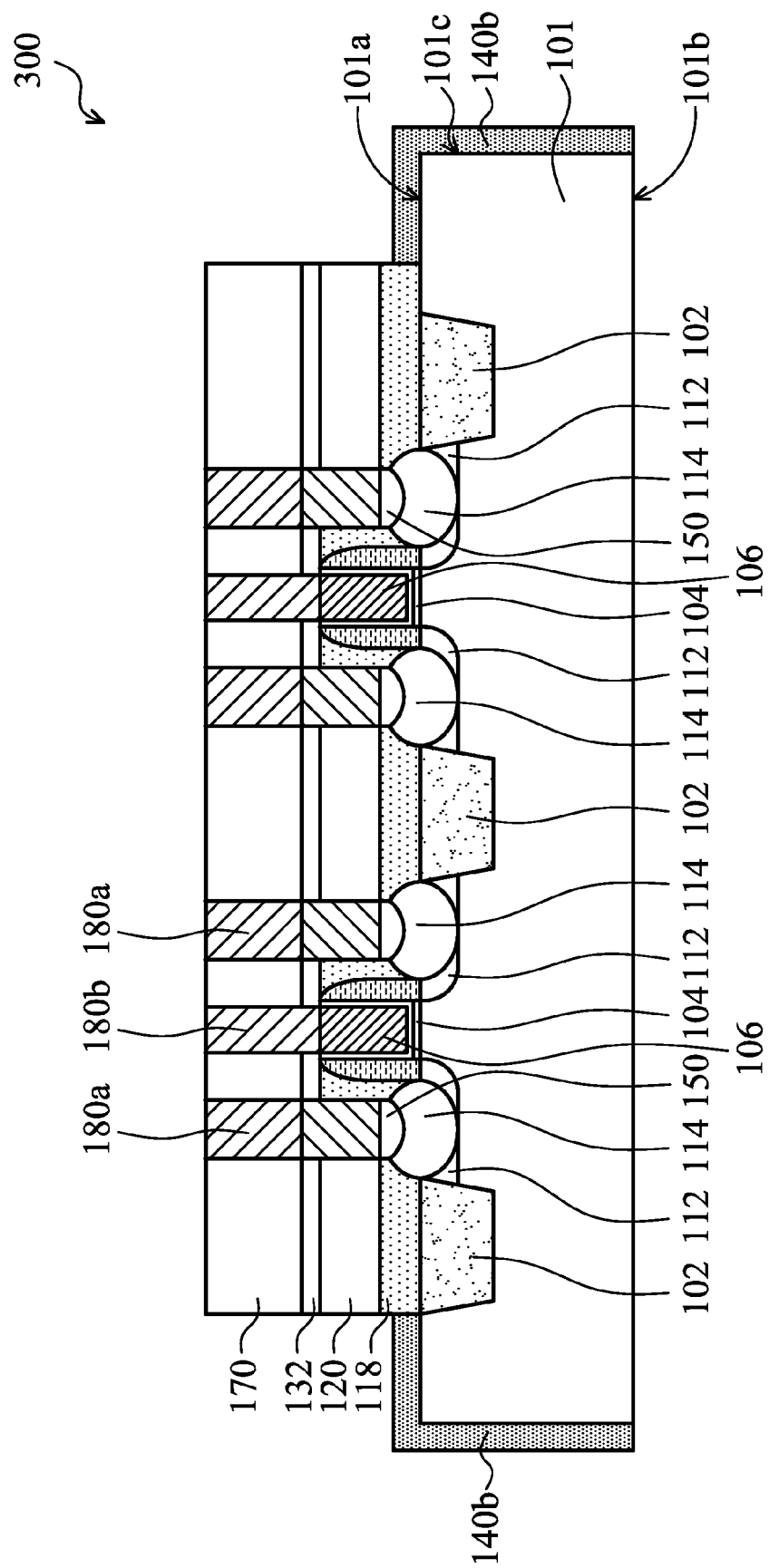
FIG. 3 is a cross-sectional view of a semiconductor device structure, in accordance with some embodiments.

FIG. 3 is a cross-sectional view of a semiconductor device structure, in accordance with some embodiments. As shown in FIG. 3, a semiconductor device structure 300 is similar to the semiconductor device structure 100 of FIG. 1L, except that the protective layer 140b of the semiconductor device structure 300 is only formed over the front surface 101a and the sidewall 101c of the wafer 101.

In accordance with some embodiments, semiconductor device structures and methods for forming the same are provided. The methods (for forming the semiconductor device structure) form a protective layer over a peripheral portion of a wafer to prevent metal silicide structures from forming over the peripheral portion. Therefore, the protective layer may prevent metal silicide structures from affecting or contaminating the subsequent processes.

In accordance with some embodiments, a method for forming a semiconductor device structure is provided. The method includes providing a wafer having a central portion and a peripheral portion surrounding the central portion. The method includes forming a first dielectric layer over the central portion. The first dielectric layer has first contact openings exposing conductive regions of the wafer. The method includes forming a protective layer over the peripheral portion. After forming the protective layer, the method includes performing a metal silicide process to form metal silicide structures over the conductive regions of the wafer.

In accordance with some embodiments, a method for forming a semiconductor device structure is provided. The method includes providing a wafer having a front surface, a back surface opposite to the front surface, and a sidewall. The method includes forming a first dielectric layer over the front surface. The first dielectric layer has contact openings exposing conductive regions of the wafer. The method includes forming a protective layer over a peripheral portion of the wafer. The protective layer is formed over the front surface and the sidewall of the wafer. The method includes after forming the protective layer, performing a metal silicide process to form metal silicide structures over the conductive regions of the wafer.

In accordance with some embodiments, a semiconductor device structure is provided. The semiconductor device structure includes a wafer having a central portion and a peripheral portion surrounding the central portion. The semiconductor device structure includes a protective layer over the peripheral portion. The semiconductor device structure includes a first dielectric layer over the central portion. The first dielectric layer has contact openings exposing conductive regions of the wafer. The protective layer surrounds the first dielectric layer. The semiconductor device structure includes metal silicide structures over the conductive regions of the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   providing a wafer having a central portion and a peripheral portion surrounding the central portion;
   forming a first dielectric layer over the central portion, wherein the first dielectric layer has a plurality of first contact openings exposing a plurality of conductive regions of the wafer, and the first contact openings are spaced apart from each other;
   after the formation of the first dielectric layer, forming a protective layer over the peripheral portion;
   after forming the protective layer, performing a metal silicide process to form a plurality of metal silicide structures over the conductive regions of the wafer;
   after the metal silicide process, forming a plurality of first contact plugs in the first contact openings to electrically connect to the conductive regions via the metal silicide structures, respectively,
   wherein the formation of the first dielectric layer comprises:
   forming a dielectric material layer over the central portion and the peripheral portion; and
   removing the dielectric material layer over the peripheral portion and portions of the dielectric material layer over the central portion;
   before the formation of the dielectric material layer, forming a contact etch stop layer over the central portion and the peripheral portion, wherein the dielectric material layer is formed over the contact etch stop layer; and
   removing the contact etch stop layer over the peripheral portion and portions of the contact etch stop layer over the central portion during the removal of the dielectric material layer over the peripheral portion and the portions of the dielectric material layer over the central portion, wherein the protective layer is adjacent to and surrounds the contact etch stop layer;
   forming a second dielectric layer over the first dielectric layer;
   forming a plurality of second contact openings in the second dielectric layer to expose the first contact plugs, respectively; and
   forming a plurality of second contact plugs in the second contact openings to electrically connect to the first contact plugs.

2. The method for forming a semiconductor device structure as claimed in claim 1, wherein the forming of the protective layer comprises:
   performing an oxidation process on the peripheral portion of the wafer.

3. The method for forming a semiconductor device structure as claimed in claim 1, wherein the first contact plugs are filled in the first contact openings, respectively.

4. The method for forming a semiconductor device structure as claimed in claim 2, wherein the oxidation process comprises dipping the peripheral portion of the wafer into an oxidizing solution.

5. The method for forming a semiconductor device structure as claimed in claim 1, wherein the wafer has a sidewall, a front surface, and a back surface opposite to the front surface, the protective layer is formed over only the front surface, and the protective layer is not formed over the sidewall and the back surface.

6. The method for forming a semiconductor device structure as claimed in claim 1, further comprising:
   after the metal silicide process, removing the protective layer.

7. A method for forming a semiconductor device structure, comprising:
   providing a wafer having a front surface, a back surface opposite to the front surface and a sidewall;

forming a first dielectric layer over the front surface, wherein the first dielectric layer is over a central portion of the wafer, the first dielectric layer has a plurality of contact openings exposing a plurality of conductive regions of the wafer, and the contact openings are spaced apart from each other;

after the formation of the first dielectric layer, forming a protective layer over a peripheral portion of the wafer, wherein the peripheral portion surrounds the central portion, and the protective layer is formed over the front surface and the sidewall of the wafer;

after forming the protective layer, performing a metal silicide process to form a plurality of metal silicide structures over the conductive regions of the wafer;

after the metal silicide process, forming a plurality of contact plugs in the first contact openings
  to electrically connect to the conductive regions via the metal silicide structures, respectively;

forming stressors in the conductive regions; and after for forming the stressors, performing a pre-amorphized implantation (PAI) process to turn portions of the stressors exposed by the first contact openings into amorphous portions;

wherein the metal silicide process is performed on the stressors to turn the amorphous portions of the stressors into the metal silicide structures, wherein the formation of the first dielectric layer comprises:

forming a dielectric material layer over the central portion and the peripheral portion; and removing the dielectric material layer over the peripheral portion and portions of the dielectric material layer over the central portion.

8. The method for forming a semiconductor device structure as claimed in claim 7, wherein the forming of the protective layer comprises:
continuously forming the protective layer over the front surface and the sidewall of the wafer.

9. The method for forming a semiconductor device structure as claimed in claim 7, wherein the forming of the protective layer further comprises:
forming the protective layer over the back surface of the wafer.

10. The method for forming a semiconductor device structure as claimed in claim 7, wherein the forming of the protective layer comprises:
performing an oxidation process on the peripheral portion of the wafer.

11. The method for forming a semiconductor device structure as claimed in claim 10, wherein the oxidation process comprises an oxygen plasma process.

12. The method for forming a semiconductor device structure as claimed in claim 10, wherein the oxidation process comprises dipping the peripheral portion of the wafer into an oxidizing solution.

13. The method for forming a semiconductor device structure as claimed in claim 1, wherein the protective layer is a continuous layer.

14. The method for forming a semiconductor device structure as claimed in claim 1, wherein the protective layer comprises oxides or nitrides.

* * * * *